United States Patent
Lahiri et al.

(10) Patent No.: US 9,000,857 B2
(45) Date of Patent: Apr. 7, 2015

(54) MID-BAND PSRR CIRCUIT FOR VOLTAGE CONTROLLED OSCILLATORS IN PHASE LOCK LOOP

(71) Applicant: STMicroelectronics International N.V., Amsterdam (NL)

(72) Inventors: Abhirup Lahiri, Delhi (IN); Nitin Gupta, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 17 days.

(21) Appl. No.: 13/919,195

(22) Filed: Jun. 17, 2013

(65) Prior Publication Data
US 2014/0368281 A1 Dec. 18, 2014

(51) Int. Cl.
*H03L 1/00* (2006.01)
*G05F 1/10* (2006.01)
*H03K 3/03* (2006.01)
*H03L 7/085* (2006.01)
*H03L 7/099* (2006.01)

(52) U.S. Cl.
CPC .............. *H03L 7/085* (2013.01); *H03L 7/0995* (2013.01)

(58) Field of Classification Search
USPC .............. 327/530, 535, 537–543; 331/57, 65, 331/185, 186
See application file for complete search history.

(56) References Cited

U.S. PATENT DOCUMENTS

| | | | | |
|---|---|---|---|---|
| 5,604,466 | A | * | 2/1997 | Dreps et al. ................ 331/113 R |
| 5,686,867 | A | * | 11/1997 | Sutardja et al. ................ 331/57 |
| 5,714,912 | A | * | 2/1998 | Fiedler et al. .................... 331/57 |
| 5,880,579 | A | * | 3/1999 | Wei et al. ....................... 323/282 |
| 5,909,150 | A | * | 6/1999 | Kostelnik et al. ................ 331/34 |
| 6,246,294 | B1 | * | 6/2001 | Gai ................................ 331/57 |
| 6,271,732 | B1 | * | 8/2001 | Herzel ............................ 331/57 |
| 6,320,458 | B1 | * | 11/2001 | Cusinato et al. .............. 327/543 |
| 7,015,766 | B1 | * | 3/2006 | Guo et al. ..................... 331/176 |
| 7,042,302 | B2 | * | 5/2006 | Chien .......................... 331/185 |
| 7,973,612 | B2 | * | 7/2011 | Raghunathan et al. ........ 331/186 |
| 8,035,453 | B1 | * | 10/2011 | Wong et al. ..................... 331/57 |
| 8,362,848 | B2 | * | 1/2013 | Raghunathan et al. ........ 331/186 |

OTHER PUBLICATIONS

Retdian, Nicodimus, et al: "Voltage Controlled Ring Oscillator With Wide Tuning Range and Fast Voltage Swing," IEEE Asia-Pacific Conference 2002, pp. 201-204.

* cited by examiner

*Primary Examiner* — Levi Gannon
(74) *Attorney, Agent, or Firm* — Gardere Wynne Sewell LLP

(57) ABSTRACT

A circuit generates a compensation signal that can remove noise in a VCO introduced by a supply signal (i.e., supply-side noise). The circuit includes two transistors connected in series. A resistor is connected between the gate of the first transistor and the supply signal, and a capacitor is connected between the gate of the second transistor and the supply signal. The circuit is designed so that the transconductance of one transistor is greater than or equal to twice the transconductance of a second transistor. The compensation signal is supplied through a capacitor, which compensates for capacitors in a VCO, to an internal supply node of the VCO. At the internal supply node, the compensation signal removes (or greatly reduces) the noise introduced by the supply signal noise, resulting in a less-noisy output signal from the VCO.

26 Claims, 1 Drawing Sheet

MID-BAND PSRR CIRCUIT FOR VOLTAGE CONTROLLED OSCILLATORS IN PHASE LOCK LOOP

BACKGROUND

The phase-noise performance of a voltage controlled oscillator (VCO) affects different specifications of analog circuits, such as the error-vector-magnitude (EVM) or the signal-to-noise ratio (SNR). One major source of noise for VCOs comes from the VCO's voltage supply. Supply noise has been shown to have a substantial impact on VCO phase noise in terms of deterministic noise. Any signal or noise on voltage supply lines will progress to the active circuitry through stray capacitances and gain of the bias network and be amplified by active circuitry of a system on a chip (SoC). These unwanted noise signals degrade device performance.

If the voltage supply of an operational amplifier (op-amp) changes, the voltage output of the op-amp should not—yet, it typically does. If a change of X volts in the op-amp's supply produces an output voltage change of Y volts, the dimensionless ratio of supply voltage to output voltage (i.e., X/Y) is commonly referred to as power supply rejection ratio (PSRR) on that supply, or simply power supply rejection (PSR) if expressed in decibels (dBs). PSRR is a measure of how well a circuit rejects supply noise, or "ripple," coming from an input power supply at various frequencies, and is very critical in many radio frequency (RF) circuits.

An open-loop PSRR curve is predominately shaped by a phase lock loop (PLL) transfer function, and the supply dependent noise at the output of the VCO is typically high-pass filtered. The PLL loop itself acts like a high pass filter for the noise at the VCO, attenuating the low frequency noise to the bandwidth of the PLL. Jitter due to the supply noise outside the bandwidth of the PLL is directly seen at the output, and thus subsequently passed to the other circuitry of the SoC.

SUMMARY

This Summary is provided to introduce a selection of concepts in a simplified form that are further described below in the Detailed Description. This Summary is not intended to identify key or essential features of the claimed subject matter. Nor is it intended to be used as an aid in determining the scope of the claimed subject matter.

One aspect relates to a circuit for reducing supply noise in a VCO of a PLL. In addition to the VCO, the PLL may include a phase detector, loop filter, and noise-reduction circuit. The phase detector generates a voltage signal that is directly proportional to the difference in phase of the two signals. This output signal is then filtered by the loop filter, and the filtered signal is used to control the VCO. Voltage supply noise in the VCO is removed by a compensation signal supplied by the noise-reduction circuit. To generate the appropriate compensation signal, the noise-reduction circuit includes two transistors with one having double the transconductance of the other in order to ensure the compensation signal is the polar opposite of the supply noise of the VCO.

In one embodiment, the noise-reduction circuit includes two transistors connected in series to each other. A resistor is coupled to the gate of a first transistor and the input voltage supply. A capacitor is positioned between the gate of the second transistor and the voltage supply. Again, in one embodiment, the circuit is designed so that the transconductance of the second transistor is twice the transconductance of the first transistor, and a compensation signal generated between the interconnected transistors is supplied to a capacitor and thereafter fed to a second circuit to eliminate (or at least reduce) supply noise present in a VCO output oscillating signal.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

DETAILED DESCRIPTION

VCOs may be adversely affected by voltage supply noise. In general, embodiments discussed herein significantly reduce voltage supply noise and/or mid-band PSRR in the VCO of a PLL—or other circuit including a VCO—using a circuit with mismatched transistors that generates a compensation signal applied to an output of a VCO. In one embodiment, the circuit reduces mid-band PSRR of a VCO without needing to change the loop dynamics of a PLL or impacting the phase-noise performance of the VCO.

One embodiment includes a circuit with two n-channel field effect transistors (FETs) connected in series to each other and a capacitor tied to a series connection point between the two FETs. The circuit also includes a second capacitor connected in parallel to one of the FETs and feeding into the gate of the other FET. In one embodiment, the conductance (gm1) of the FET closest to the voltage supply is designed to be twice the conductance (gm2) of the second FET (i.e., gm1 equals two times gm2).

The circuit provides improvement in PSRR across corners of approximately −10 dB to −15 dB due to the gain variation of the supply voltage generator and the mismatch of capacitors in the aforesaid circuit. Moreover, the circuit does not require any additional SoC area or power, and thus can be easily added to conventional VCO structures (e.g., a cascade-based VCO structure).

Before turning to the drawings, it may be helpful to clarify a couple key definitions and concepts. First, while n-channel FETs are discussed herein, embodiments are not limited to such transistors. One skilled in the art will appreciate and understand that p-channel FETs, metal-oxide semiconductor FETs (MOSFETs), and complementary metal-oxide semiconductor FETs may be used and may require additional circuitry. Second, PLL circuits generally include a phase detector, loop filter, and VCO that work in conjunction to generate an output oscillating voltage signal with a phase related to the phase of an input reference oscillating signal. The phase detector compares the phase of the input signal to the phase of a feedback signal derived from the output oscillating signal, and may, in some embodiments, adjust the frequency of the output signal to keep the phases matched—or as close as possible by being within a particular variance (e.g., 0-3%). The loop filter sits between the phase detector and the VCO and filters the control output from the phase detector (e.g., through high-, mid-, or low-pass filtering) supplied to control the VCO. One skilled in the art will understand and appreciate that PLLs may include additional circuitry. Examples include a charge pump for converting digital error pulses to analog error current, a frequency divider for dividing the VCO output signal for phase comparison to the reference signal, and/or a level shifter for amplifying VCO signals.

Figure 1:
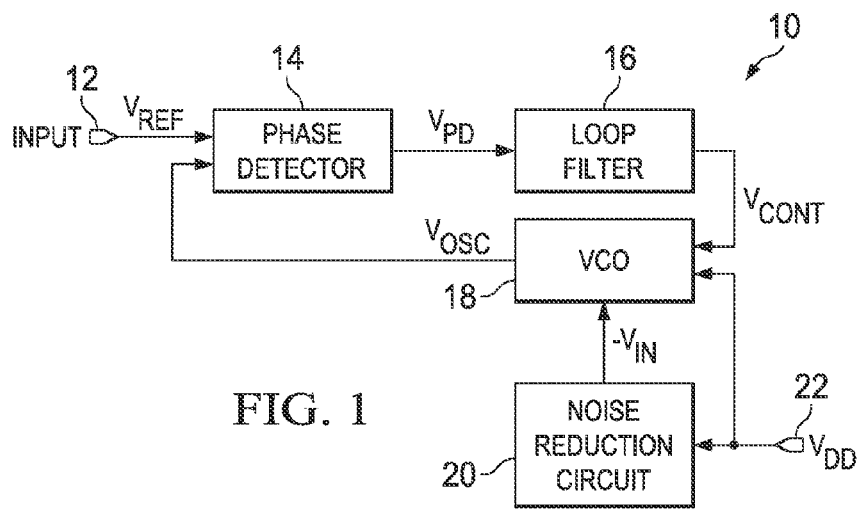
FIG. 1 illustrates a block diagram of a PLL circuit.

FIG. 1 illustrates one embodiment of a PLL circuit 10. PLL circuit 10 includes a phase detector 14, loop filter 16, VCO 18, and noise-reduction circuit 20. Phase detector 14 receives an input analog reference oscillating signal ($V_{REF}$) from input 12 and compares $V_{REF}$ with a stabilized output voltage ($V_{OSC}$) from VCO 18. $V_{OSC}$ represents the output voltage of the VCO after noise-reduction circuit 20 has removed—or at least reduced—supply signal noise introduced by $V_{DD}$ at voltage supply input 22.

$V_{DD}$ is a voltage supply input that is subject signal noise (e.g., voltage or current noise), and noise-reduction circuit 20 compensates for this supply signal noise of $V_{DD}$ by producing and supplying VCO 18 with a compensation signal ($-V_{IN}$). For the sake of clarity, embodiments discussed herein refer to a compensation signal as $-V_{IN}$, which appears to connote only voltage. This is not the case in all embodiments, as the compensation signal may alternatively or additionally comprise a compensation current. One skilled in the art will appreciate that voltage and current are related through impedance, and therefore techniques mentioned herein for reducing voltage supply noise may also be used to reduce current supply noise.

In operation, phase detector 14 produces a signal ($V_{PD}$) proportional to the phase difference between $V_{REF}$ and $V_{OSC}$. To do so, phase detector 14 may include level-shifting circuitry for shifting the voltage level of $V_{REF}$, $V_{OSC}$, or both. Error signal $V_{PD}$ is filtered by loop filter 16 to produce a control signal $V_{CONT}$ for controlling VCO 18.

VCO 18 generates an oscillating output signal $V_{OSC}$ that is supplied to phase detector 14 for comparison with $V_{REF}$. While oscillating output signal $V_{OSC}$ of VCO 18 is shown being compared to the reference signal $V_{REF}$, some embodiments may insert a frequency divider (not shown) between VCO 18 and phase detector 14 in order to impose a frequency difference between $V_{OSC}$ and $V_{REF}$. Those embodiments will supply $V_{OSC}$ to the frequency divider, which divides the frequency by a factor (N), and use the output of the frequency divider ($V_{OSC}/N$) as the input to phase detector 14 for comparison to $V_{REF}$.

Noise-reduction circuit 20 receives $V_{DD}$ from input 22 and generates compensation signal $-V_{IN}$ to remove or reduce the supply noise in $V_{DD}$. At an internal node of VCO 18, $-V_{IN}$ combines with an internal supply signal to the oscillating portion of VCO 18 to remove or reduce the supply voltage noise of $V_{DD}$. This creates a stabilized internal signal (referenced below as "$V_{STAB}$") that can be passed through an oscillating portion of VCO 18 to generate $V_{OSC}$.

When a phase difference between input frequency signal $V_{REF}$ and the feedback frequency signal $V_{OSC}$ exists, control voltage $V_{CONT}$ is adjusted so that the output frequency of VCO 18 is increased or decreased to lock the frequencies of $V_{OSC}$ to $V_{REF}$. To adjust the phase of $V_{OSC}$ in a first direction, a charge pump may be used in one embodiment to source current into one or more capacitors for increasing the oscillation frequency of VCO 18. To adjust the phase of $V_{OSC}$ in a second, opposite direction, the charge pump may sink current from the capacitor to decrease the oscillating frequency of VCO 18. Other configurations and techniques may alternatively be used to adjust and phase lock $V_{OSC}$ to $V_{REF}$, and such configurations and techniques are fully contemplated by the embodiments discussed herein or the equivalents thereof.

Loop filter 16 applies a high-, mid-, or low-pass filter to $V_{PD}$ to generate control signal $V_{CONT}$ that is used to adjust the frequency or phase of components (e.g., oscillators) of VCO 18, and thus close the phase difference between $V_{OSC}$ and $V_{REF}$. Those skilled in the art will appreciate and understand the electrical components that can be used in different high-, mid-, and low-pass filters, so these components need not be discussed at length herein.

Phase detector 14 may be an analog or digital phase detector and may include various circuitry. In one digital embodiment, phase detector 14 comprises an exclusive OR (XOR) gate that receives $V_{REF}$ and $V_{OSC}$ and produces a high value for $V_{PD}$ whenever the signals have different high or low voltages. More complex digital phase-frequency detectors may have an output that allows a reliable indication of an out-of-lock condition, which is beneficial for different PLL applications that need to know when the loop is out of lock. In analog embodiments, phase detector 14 may include an analog multiplier or mixer. Some phase detectors 14, such as a "bang bang" charge-pump phase detector, may have a dead band where the phases of $V_{REF}$ and $V_{OSC}$ are close enough that phase detector 14 detects no phase error.

Figure 2:
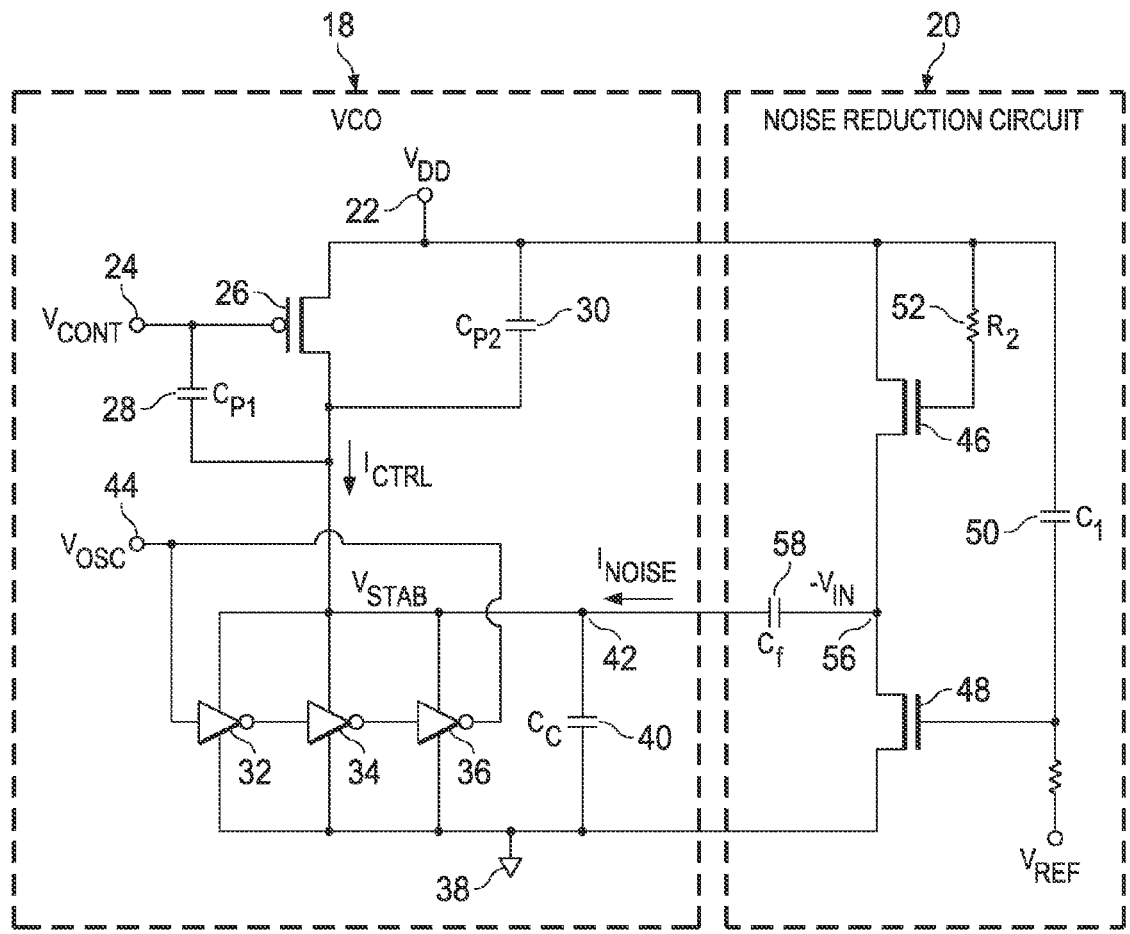
FIG. 2 illustrates a schematic view of noise-reduction circuit supplying a compensation signal to a VCO.

FIG. 2 illustrates a schematic view of noise-reduction circuit 20 supplying a compensation signal ($-V_{IN}$) to VCO 18 in order to eliminate signal noise introduced by supply signal $V_{DD}$ from output signal $V_{OSC}$. VCO 18 receives inputs 22 and 24 that respectively supply source signal $V_{DD}$ and control signal $V_{CONT}$ to the source and gate of p-channel FET 26. Capacitor 28 ($C_{P1}$) is coupled to the drain and the gate of FET 26. Capacitor 30 ($C_{P2}$) is coupled between the drain of FET 26 and $V_{DD}$. The drain of FET 26 feeds into the positive supply internal node 42 of three serially connected inverters 32, 34, and 36 in the oscillating portion of VCO 18. The output of final inverter 36 provides feedback to the input of first inverter 32 and generates output signal $V_{OSC}$, which is directed out of VCO 18 through output 44. Capacitor Cc 40 is coupled between ground 38 and node 42.

Noise-reduction circuit 20 provides compensation signal $-V_{IN}$ to remove or reduce supply noise introduced by $V_{DD}$ from output signal $V_{OSC}$. Noise-reduction circuit 20 is designed to generate $-V_{IN}$ based on the actual supply noise in $V_{DD}$. Noise-reduction circuit 20, which represents merely one embodiment, includes two n-channel FETs 46 and 48 connected in series with each other in an enhancement-load-device configuration, and $-V_{IN}$ is generated at series connection point 56. Other embodiments will use different circuitry to generate $-V_{IN}$ based on the noise in $V_{DD}$.

$V_{DD}$ supplies a signal with supply noise to the drain and gate (through resistor R2 52) of FET 46 and to capacitor C1 50 tied to the gate of FET 48. In one embodiment, noise-reduction circuit 20 is designed so that the transconductance associated with FET 46 (gm2) is less than or equal to half the transconductance associated with FET 48 (gm1). Put another way, gm1 is greater than or equal to twice that of gm2.

Compensation capacitor Cf 58 is connected at series connection point 56 to compensate for the combined capacitance of $C_{P1}$ 28 and $C_{P2}$ 30, making the compensation signal $-V_{IN}$ supplied to internal node 42 specific to just the noise present in $V_{DD}$. Noise cancelation may also depend on matching compensation capacitor Cf 58 with the combined capacitance of $C_{P1}$ 28 and $C_{P2}$ 30. In one embodiment, Cf 58 is approximately or exactly equal to parasitic capacitance $C_P$, which equals $C_{P1}$ 28 plus $C_{P2}$ 30:

$$Cf = C_{P1} + C_{P2}$$

Compensation capacitor Cf 58 may be a variable capacitor or may be replaced with a varactor diode. Other additional circuitry may be added to compensate for C$_P$ in order to cancel noise in alternative embodiments. For instance, one embodiment includes a PMOS transistor that matches FET 26 positioned between Cf 58 and node 42 and a resistor coupled between V$_{DD}$ and a point between Cf 58 and the PMOS transistor.

Compensation signal $-V_{IN}$ generated at series connection point 56 equals the voltage provided by V$_{DD}$ multiplied by one minus the ratio of gm1 to gm2:

$$-V_{IN} = (1-gm1/gm2)*V_{DD}$$

$-V_{IN}$, after being filtered by Cf 58, is supplied to internal node 42 of VCO 18 to reduce the supply noise of V$_{DD}$, resulting in the stabilized signal V$_{STAB}$. The ratio of V$_{STAB}$ to V$_{IN}$ for a high frequency PSR model of VCO 18 can be represented by the following equation:

$$V_{STAB}/V_{IN} = \mu(C_{P-Cf})R_{osc}/(1+\mu R_{osc}(C_P+Cf+Cc))$$

Where C$_P$ equals the sum of C$_P$1 28 plus C$_P$2 30, $\mu$ is a transform value (e.g., Laplace transform), and R$_{OSC}$ represents the combined resistance of the three-ring oscillator made up of inverters 32, 34, and 36.

Again, while embodiments discussed herein denote the compensation signal as a voltage (i.e., $-V_{IN}$), a compensation current (shown as I$_{NOISE}$) may additionally or alternatively be generated and supplied to internal node 42. In embodiments that compensate for noise current, I$_{NOISE}$ will reduce such noise at internal node 42.

V$_{CONT}$ is received at input 24 and represents the input voltage supplied to VCO 18 by another portion of a PLL, such as the output voltage of loop filter 16 in FIG. 1. When V$_{CONT}$ supplies a threshold voltage to the gate of FET 26, I$_{CTRL}$ drives the oscillation frequency of inverters 32, 34, and 36. I$_{CTRL}$ triggers inverters 32, 34, and 36 to oscillate and consequently generate output signal V$_{OSC}$. V$_{OSC}$ can be calculated using the following equation:

$$V_{OSC} = \int (I_{CTRL}/C_G) dt$$

Where C$_G$ represents the parasitic capacitance (if any) between inverters 32, 34, and 36. Without noise-reduction circuit 20 supplying compensation signal $-V_{IN}$, the noise of V$_{DD}$ would be present in V$_{OSC}$. Supplying $-V_{IN}$ removes (or at least reduces) the supply noise of V$_{DD}$ at internal node 42, resulting in stabilized signal V$_{STAB}$.

The frequency at which inverters 32, 34, and 36 oscillate can be expressed by the following formula:

$$f_{OSC} = 1/2N\tau$$

Where $\tau$ equals the delay in one inverter stage, and in a typical ring oscillator, $\tau$ is given by the following equation:

$$\tau = (V_{OSC})(C_G)/I_{CTRL}$$

V$_{OSC}$ represents the voltage from inverter 36, and, again, C$_G$ represents the parasitic capacitance (if any) between inverters 32, 34, and 36. The oscillation frequency f$_{OSC}$ is set by the current I$_{CTRL}$ supplied by FET 26 and can be controlled—because C$_G$ is a fixed parameter—by varying I$_{CTRL}$ using control signal V$_{CONT}$.

VCO oscillation is created in VCO 18 from the odd number of inversions in the three-ring oscillating portion of VCO 18. While FIG. 2 shows three inverters, other odd number of inverters may alternatively be used (e.g., 5, 7, etc.). The feedback from inverters 32, 34, and 36 is inverting creating an initial bias equilibrium at the transition voltages between the inverters' gates. One skilled in the art will understand that loop gain greater than unity is a necessary condition for oscillation, and unbuffered inverters typically have a gain between 7 and 15 with capacitive loads.

VCO 18 is only one VCO configuration used by embodiments discussed herein, and alternative VCOs may be used in other embodiments. For example, an alternative embodiment circuit includes an inductive resonator in parallel with a resonant oscillator circuit to generate a signal at a frequency where an inductor resonates with a load capacitance. Such a circuit provides the added benefit of easily isolating the resonator from a load like FET 26.

Accordingly, various modifications to these embodiments may be made without departing from the scope of the present disclosure and the claims provided below. The subject matter of the present invention is described with specificity herein to meet statutory requirements. The description itself is not, however, intended to limit the scope of this patent. The claimed subject matter might also be embodied in other ways, to include different steps or combinations of steps similar to the ones described herein, in conjunction with other present or future technologies.

What is claimed is:

1. An apparatus, comprising:
   a voltage supply input subject to supply noise;
   a VCO that generates an output signal having the supply noise; and
   a noise-reduction circuit having an input coupled to the voltage supply input and having an output capacitively coupled to a supply node of the VCO, wherein said output is configured to supply a compensation signal that reduces the supply noise in the output signal of the VCO.

2. The apparatus of claim 1, wherein the VCO comprises an oscillation portion that includes an odd number of inverters connected in series with a final inverter providing feedback to an initial inverter.

3. The apparatus of claim 2, wherein the supply node is common to the inverters.

4. The apparatus of claim 1, wherein the noise-reduction circuit comprises:
   a first FET having a first transconductance; and
   a second FET coupled in series to the first FET, the second FET having a second transconductance that is double the first transconductance, wherein the supply node is a series connection point between the first FET and the second FET.

5. The apparatus of claim 4, wherein the first FET and the second FET are n-type FETs.

6. The apparatus of claim 1, wherein the VCO comprises a p-type FET coupled to the voltage supply input and configured to receive a control signal.

7. The apparatus of claim 6, wherein the compensation signal comprises at least one member of a group comprising a compensation voltage and a compensation current.

8. The apparatus of claim 6, wherein the control signal is based on a difference in phase error between a reference input signal and the output signal.

9. The apparatus of claim 1, wherein the output signal is supplied to at least one member of a group comprising a frequency divider and a phase detector.

10. An apparatus for reducing supply voltage noise, comprising:
    a VCO receiving a control signal and generating an output signal that includes the supply voltage noise;
    a noise-reduction circuit coupled to the VCO, the noise-reduction circuit configured to generate a voltage supply compensation signal that reduces the supply voltage noise present in the output signal; and a capacitive coupling circuit configured to apply the voltage supply compensation signal to a supply node of the VCO.

11. The apparatus of claim 10, wherein the noise-reduction circuit comprises:
   a first FET having a first transconductance; and
   a second FET coupled in series to the first FET, the second FET having a second transconductance equal to double the first transconductance, wherein the voltage supply compensation signal is generated at a series connection point between the first FET and the second FET.

12. The apparatus of claim 11, wherein the capacitive coupling circuit further comprises a capacitor coupled between the series connection point and the supply node of said VCO.

13. The apparatus of claim 10, further comprising:
   a phase detector configured to compare a phase of a reference voltage with a phase of the output signal; and
   a loop filter configured to remove a portion of an output of the phase detector and generate a filtered signal.

14. The apparatus of claim 10, wherein the VCO is configured to receive the voltage supply compensation signal at a node coupled to a supply input of an oscillation portion of the VCO.

15. The apparatus of claim 10, wherein the oscillation portion comprises one or more inverters coupled in series and said supply input is a voltage supply node for said one or more inverters.

16. An apparatus, comprising:
   a first circuit configured to receive a power supply subject to supply noise and generate an output signal with the supply noise; and
   a noise-reduction circuit configured to receive the power supply, generate a supply compensation signal based on the supply noise, and supply the supply compensation signal to the first circuit to reduce the supply noise in the output signal;
   the noise-reduction circuit comprising:
      two FETs coupled in series at a series connection point, and
      a capacitor coupled between the series connection point and an internal supply node of the first circuit.

17. The apparatus of claim 16, wherein the first circuit comprises two capacitors coupled to a third FET, wherein the two capacitors have an aggregate capacitance equal to a capacitance of the capacitor coupled to the series connection point.

18. The apparatus of claim 16, wherein the supply compensation signal comprises at least one member of a group comprising a compensation voltage and a compensation current.

19. The apparatus of claim 16, wherein the supply compensation signal is proportional to the supply noise.

20. An apparatus, comprising:
   a voltage supply input subject to supply noise;
   a VCO that generates an output signal having the supply noise; and
   a noise-reduction circuit coupled to the voltage supply input and configured to supply a compensation signal that reduces the supply noise in the output signal of the VCO;
   the noise-reduction circuit comprising:
      a first FET having a first transconductance, and
      a second FET coupled in series to the first FET, the second FET having a second transconductance that is different than the first transconductance, wherein the compensation signal is generated at a series connection point between the first FET and the second FET.

21. The apparatus of claim 20, wherein the second transconductance is equal to double the first transconductance.

22. The apparatus of claim 20, wherein the first FET and the second FET are n-type FETs.

23. An apparatus, comprising:
   a voltage supply input subject to supply noise;
   a VCO that generates an output signal having the supply noise and comprising:
      a supply FET that passes the supply noise therethrough and comprising a first conduction terminal coupled to the voltage supply input, a second conduction terminal, and a control terminal,
      a first capacitor to capacitively couple the control terminal of the supply FET to the second conduction terminal of the supply FET and having a first capacitance, and
      a second capacitor to capacitively coupled the first conduction terminal of the supply FET to the second conduction terminal of the supply FET and having a second capacitance; and
   a noise-reduction circuit configured to apply a voltage supply compensation signal to a supply node of the VCO input via a third capacitor having a third capacitance equal to a sum of the first capacitance and the second capacitance, wherein the compensation signal reduces the supply noise in the output signal of the VCO.

24. The apparatus of claim 23, further comprising a shunt capacitor coupled in parallel with the VCO.

25. The apparatus of claim 23, wherein the noise-reduction circuit comprises:
   a first FET having a first transconductance; and
   a second FET coupled in series to the first FET, the second FET having a second transconductance equal to double the first transconductance, wherein the voltage supply compensation signal is generated at a series connection point between the first FET and the second FET.

26. The apparatus of claim 25, further comprising a fourth capacitor coupled between a first conduction terminal of the first FET and a control terminal of the second FET.

* * * * *